United States Patent [19]
Tobin

[11] Patent Number: 5,485,526
[45] Date of Patent: Jan. 16, 1996

[54] MEMORY CIRCUIT FOR LOSSLESS DATA COMPRESSION/DECOMPRESSION DICTIONARY STORAGE

[75] Inventor: Jeffrey P. Tobin, Corvallis, Oreg.

[73] Assignee: Hewlett-Packard Corporation, Palo Alto, Calif.

[21] Appl. No.: 183,100

[22] Filed: Jan. 14, 1994

Related U.S. Application Data

[63] Continuation of Ser. No. 891,872, Jun. 2, 1992, abandoned.
[51] Int. Cl.⁶ ............................... H03M 7/40; G06K 9/36
[52] U.S. Cl. ............................ 382/232; 341/67; 341/106
[58] Field of Search ............................... 382/56; 341/51, 341/67, 106

[56] References Cited

U.S. PATENT DOCUMENTS

| | | | |
|---|---|---|---|
| 4,464,650 | 8/1984 | Eastman et al. | 340/347 |
| 4,558,302 | 12/1985 | Welch | 340/347 |
| 4,814,746 | 3/1989 | Miller et al. | 341/95 |
| 4,847,619 | 7/1989 | Kato et al. | 341/106 |
| 5,003,307 | 3/1991 | Whiting et al. | 341/57 |
| 5,016,009 | 5/1991 | Whiting et al. | 341/67 |
| 5,136,289 | 8/1992 | Yoshida et al. | 341/51 |
| 5,151,697 | 9/1992 | Bunton | 341/51 |
| 5,153,591 | 10/1992 | Clark | 341/51 |

OTHER PUBLICATIONS

Product Specification AHA3101 Data Compression Coprocessor IC; AHA; No Date; pp. 3–86.
Hewlett Packard Journal Jun. 1989; Reel-To-Reel Tape Drive; pp. 2–7.

*Primary Examiner*—Stephen Chin
*Assistant Examiner*—Timothy J. May

[57] ABSTRACT

Data is compressed/decompressed according to the address location of data entries contained within a dictionary built in a content addressable memory 88. During data compression, character combinations which have not previously occurred within the input data stream are encoded as new data entries within the dictionary. When the character string OMEGA-K fails to match any existing dictionary entry, the address of the data entry (OMEGA) is output as a codeword representing the matched portion of the character string and OMEGA-K are stored in a new address location for later use. In compression, update circuitry 84 allows a memory search and a data write to be performed during the same clock cycle. Compressed data strings are decompressed by using the compressed data characters as addresses for link list traversal of the decompression dictionary. The data entry addressed by the data character is output if it does not require further decompression. If the data entry read from memory contains another codeword, the codeword is fed back to the address decoder as the next dictionary address.

10 Claims, 7 Drawing Sheets

MEMORY CIRCUIT FOR LOSSLESS DATA COMPRESSION/DECOMPRESSION DICTIONARY STORAGE

RELATED PATENT DATA

This patent resulted from a continuation application of U.S. application Ser. No. 07/891,872, filed Jun. 2, 1992, now abandoned.

BACKGROUND OF THE INVENTION

This invention relates generally to data compression and decompression methods and apparatus, and more particularly to implementations of lossless data compression algorithms which use a dictionary to store compression and decompression information.

A major class of compression schemes encode multiple-character strings using binary sequences or "codewords" not otherwise used to encode individual characters. The strings are composed of an "alphabet," of single-character strings. This alphabet represents the smallest unique piece of information the compressor processes. Thus, an algorithm which uses eight bits to represent its characters has 256 unique characters in its alphabet. Compression is effective to the degree that the multiple-character strings represented in the encoding scheme are encountered in a given file or data stream. By analogy with bilingual dictionaries used to translate between human languages, the device that embodies the mapping between uncompressed code and compressed code is commonly referred to as a "dictionary."

Generally, the usefulness of a dictionary-based compression scheme is dependent on the frequency with which the dictionary entries for multiple-character strings are used. If a fixed dictionary is optimized for one file type it is unlikely to be optimized for another. For example, a dictionary which includes a large number of character combinations likely to be found in newspaper text files is unlikely to compress efficiently data base files, spreadsheet files, bit-mapped graphics files, computer-aided design files, et cetera.

Adaptive compression schemes are known in which the dictionary used to compress given input data is developed while that input data is being compressed. Codewords representing every single character possible in the uncompressed input data are put into the dictionary. Additional entries are added to the dictionary as multiple-character strings are encountered in the file. The additional dictionary entries are used to encode subsequent occurrences of the multiple-character strings. For example, matching of current input patterns is attempted only against phrases currently residing in the dictionary. After each match, a new phrase is added to the dictionary. The new phrase is formed by extending the matched phrase by one symbol (e.g. the input symbol that "breaks" the match). Compression is effected to the extent that the multiple-character strings occurring most frequently in the stream are encountered as the dictionary is developing.

During decompression, the dictionary is built in a like manner. Thus, when a codeword for a character string is encountered in the compressed file, the dictionary contains the necessary information to reconstruct the corresponding character string. Widely-used compression algorithms that use a dictionary to store compression and decompression information are the first and second methods of Lempel and Ziv, called LZ1 and LZ2 respectively. These methods are disclosed in U.S. Pat. No. 4,464,650 to Eastman et al., and various improvements in the algorithms are disclosed in U.S. Pat. No. 4,814,746 to Miller et al. These references further explain the use of dictionaries.

One bottleneck to compression/decompression performance is the amount of time required to search the dictionary for previously encountered character strings. Traditionally, hashing algorithms are used to search for previously-stored dictionary entries and to locate available memory locations for new character strings. Typical arrangements use a RAM memory with two to four storage locations for each dictionary entry, as disclosed in U.S. Pat. No. 4,558,302 to Welch (LZW).

The hashing algorithm maps each unique dictionary entry into the RAM space at an address based on some simple arithmetic function of the data word contents. Since such an algorithm uses the entire word or fields within the word to calculate the mapping address, more than one data word might map to the same location in memory, causing a hashing collision. In this case an alternative location must be found for the data. Inevitably, as the RAM locations fill up, a second dictionary entry will hash to a previously-used location. This situation must be resolved before compression can continue. Hashing circuitry and, specifically, hashing collisions, add considerable complexity to the compression/decompression system logic, in addition to reducing system throughput.

Typically, the dictionary based upon the data being compressed will be a small subset of all possible data entries. Therefore, one method for reducing hashing collisions is to increase the number of dictionary storage locations. This approach, however, increases system complexity and cost and prohibits integrating the memory with the compression/decompression control logic. In addition, a larger memory increases the search time required to determine if a character string has previously been loaded into memory.

A second bottleneck to data compression/decompression is the amount of time and circuit complexity required to encode and decode data character strings. For example, during data compression, after a character string is found not to match any of the data phrases previously stored within memory, it must be stored in an unoccupied data memory location. A codeword must be generated that uniquely identifies the stored character string and subphrases within a character string that previously matched dictionary data entries. The codeword must then be stored so that it can be combined with additional characters during further data compression operations.

During data decompression, a compressed data codeword may represent an uncompressed data character and an additional codeword, for example, a link to the rest of the uncompressed data string, as described in *Hewlett-Packard Journal*, June 1989, pp. 27–31. The described HP-DC scheme encodes codewords sequentially and stores the codewords (OMEGA) concatenated with a next byte (K) at dictionary address locations determined by a hashing algorithm. Therefore, the dictionary must be read several times before the actual decompressed data string is generated. Since the compressing and decompressing process is iterative, any additional clock cycles, other than the clock cycles used for dictionary access, significantly increase overall compression and decompression time. Present encoding, decoding, and dictionary search methods, however, require more than one clock cycle to compress or decompress each input character. In addition, these encoding and decoding algorithms require complex compression and decompression hardware.

Accordingly, there is a need for improving the encoding and decoding of data in a dictionary-based data compression/decompression system.

SUMMARY OF THE INVENTION

An object of the invention, therefore, is to reduce the amount of time required to encode/decode a character string in a dictionary-based data compression/decompression system.

Another object of the invention is to simplify the search of a data compression/decompression dictionary for previously encountered strings of characters.

Yet another object of the invention is to simplify searching procedures and circuitry and to reduce hashing collisions.

A further object of the invention is to maximize data compression capacity in a dictionary-based data compression/decompression system with a minimal amount of memory.

The invention is a dictionary-based compression/decompression system architecture and method which utilizes the address values of stored data entries in the dictionary of a compression/decompression system to simplify encoding as well as decoding circuitry. The system preferably uses a content addressable memory (CAM) with additional logic circuitry including local feedback circuitry to provide special functions that speed up memory access and simplify external compression/decompression logic. The memory structure has unique features, that can provide lossless data compression or decompression at a sustained rate of one character per clock cycle without hashing or potential for hashing collisions.

Specifically, the system comprises an associative memory that encodes character strings according to the address locations of data entries contained within the memory. An input character string combination which has not previously occurred within the input data stream is stored as a new data entry within the dictionary. The CAM is organized into "words" which each store a unique character string data entry. The memory performs an associative parallel search with an input character string with every bit in a "word," on all words previously stored in the dictionary. In the event of a match, a match line associated with the data entry is activated. All the match lines are then encoded into a single codeword representing the character string. The codeword is then combined with the next input character and again compared with the data entries previously stored in memory. Thus, character strings are assigned codewords according to their address locations in memory. When a search fails, the codeword (OMEGA) representing the last previously-matched character string (e.g., its address) is output and another search is started with a new character string starting with the character (K) that caused the match to fail.

The compressed data character (codeword) is a pointer to a data entry in the dictionary. Therefore, character strings are decoded by using the compressed data character as an address into the decompression dictionary. For example, initially, an external compressed character is used as an address into the dictionary. The data entry at the decoded address location is then read. If the data entry output from memory does not require further decompression (e.g., the memory output is the "root" of a linked list) then the data entry is output. If the data entry contains another codeword (e.g., a further encoded link to another dictionary address location), then the codeword is fed back to the memory as the next dictionary address.

An internal address generator is used for both compression and decompression and resets coincident with a memory reset. Any write to the memory (an explicit write or a failed match) will result in the address incrementing to the next address. Incrementing need not be sequential but may be, for example, pseudorandom, as long as both compressor and decompressor address generators are initiated to the same state and increment in the same way, with the result that both compression and decompression dictionaries will be identical. This logic eliminates the need for generating/storing addresses in external control logic, and can result in improved compression decompression performance (e.g., fewer clock cycles and faster data compression).

To further reduce the time required for data compression, special update circuitry allows a memory search and a data write to be performed during the same clock cycle. When a character string is compared with the data entries within memory, a failed search requires the string to be stored as a new data entry. The next available address location is already known from the address generator and the character string is already residing at the memory data input. Therefore, control logic can be used to automatically write the character string into memory if no match occurs during the search. Thus, the memory is automatically updated during the memory search clock cycle. If a match is found during the search operation, the update circuitry prevents the character string from being loaded into memory as a valid data entry.

The system and method summarized above thereby provides a simple, inexpensive, and versatile system for fast compression and decompression of data. It can be implemented in software on a general purpose computer or in hardware using custom or semicustom integrated circuitry. The system and method can be used to implement storage/retrieval of linked list data structures. And it can be readily adapted to various adaptive dictionary-based encoders.

The foregoing and other objects, features and advantages of the invention will become more readily apparent from the following detailed description of a preferred embodiment which proceeds with reference to the drawings.

DETAILED DESCRIPTION

Figure 1:
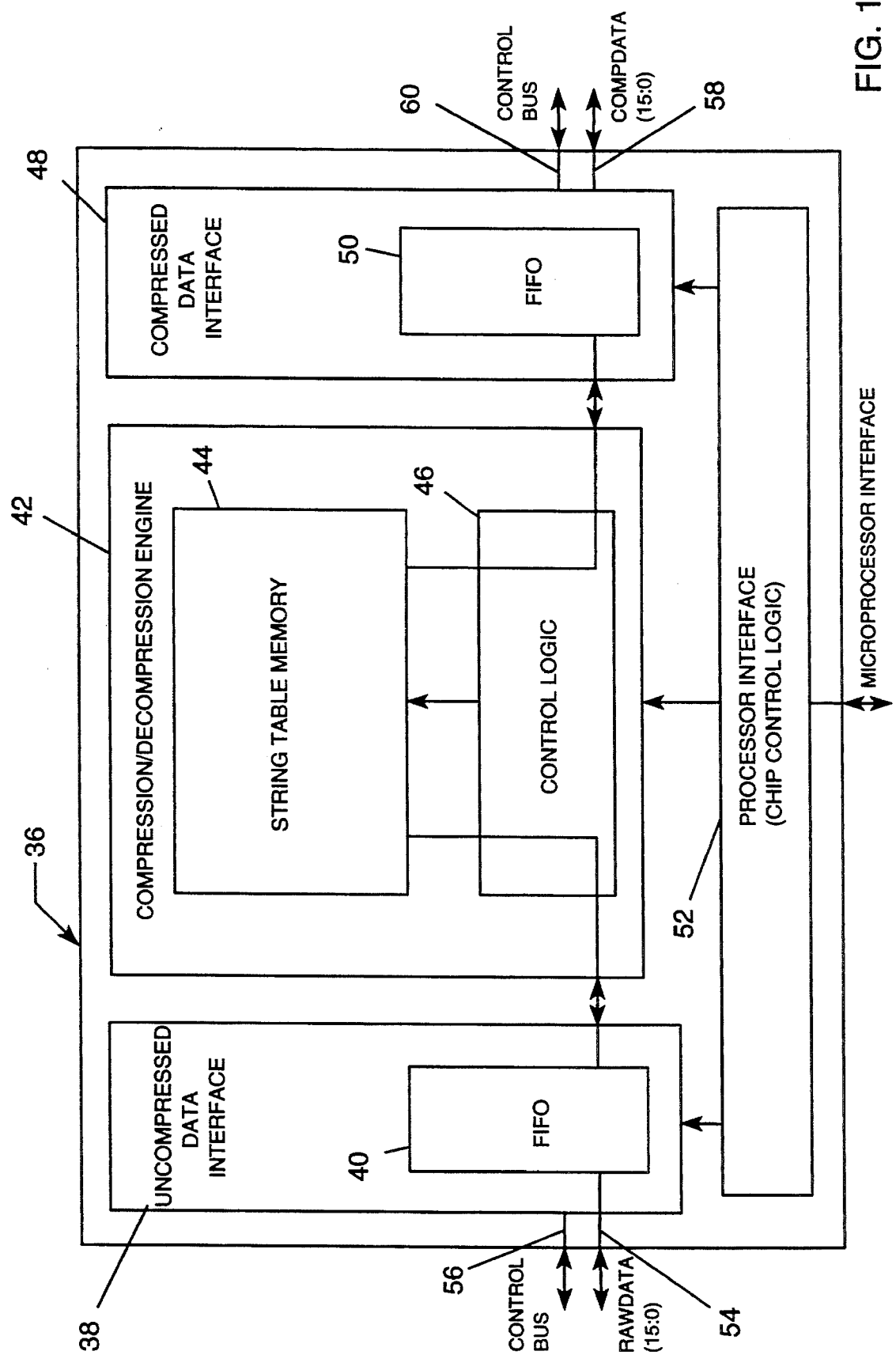
FIG. 1 is a block diagram showing a hardware implementation of the data compression/decompression system embodying the present invention.

FIG. 1 is a block diagram showing the overall arrangement of a preferred circuit 36 for a compression/decompression system according to the invention. The circuit 36 includes a data compression/decompression (CD) engine 42, an un-compressed data interface 38, a compressed data interface 48, and a processor interface 52. The CD engine 42 comprises a string table memory 44 and control logic 46.

The uncompressed data interface 38 transfers uncompressed data (RAWDATA) over data bus 54 and compressed interface 48 transfers compressed data (COMPDATA) over data bus 58. External control signals for interfaces 38 and 48 are received over control buses 56 and 60, respectively. Each interface contains a First-in/First-out data buffer (FIFO) 40, 50 and additional interface circuitry (not shown).

The circuit 36 can be used in either a compression or a decompression mode or state and can be switched between modes for bidirectional communications. Alternatively, the circuit 36 can be used as dedicated compressor with simplified dedicated decompression circuit with a RAM replacing blocks 82, 84, 90, 92 and 94. The following description assumes circuit 36 is used for both compression and decompression.

In the compression mode, the uncompressed data interface 38 receives uncompressed data characters from the data bus 54 and supplies them via data buffer 40 to compression/decompression engine 42. The string table memory 44 and control logic 46 within CD engine 42 compress the characters into codewords that are output on data bus 58 via data buffer 50. In the decompression mode, the compressed data interface 48 receives compressed data codewords from the data bus 58 and provides them to the CD engine 42 via data buffer 50. String table 44 in cooperation with control logic 46 decompress the data codewords into character strings and output the result on data bus 54 via data buffer 40. A microprocessor (not shown) controls registers for setting the direction of data flow and compression/decompression mode, and controls other miscellaneous functions through processor interface 52.

Figure 2:
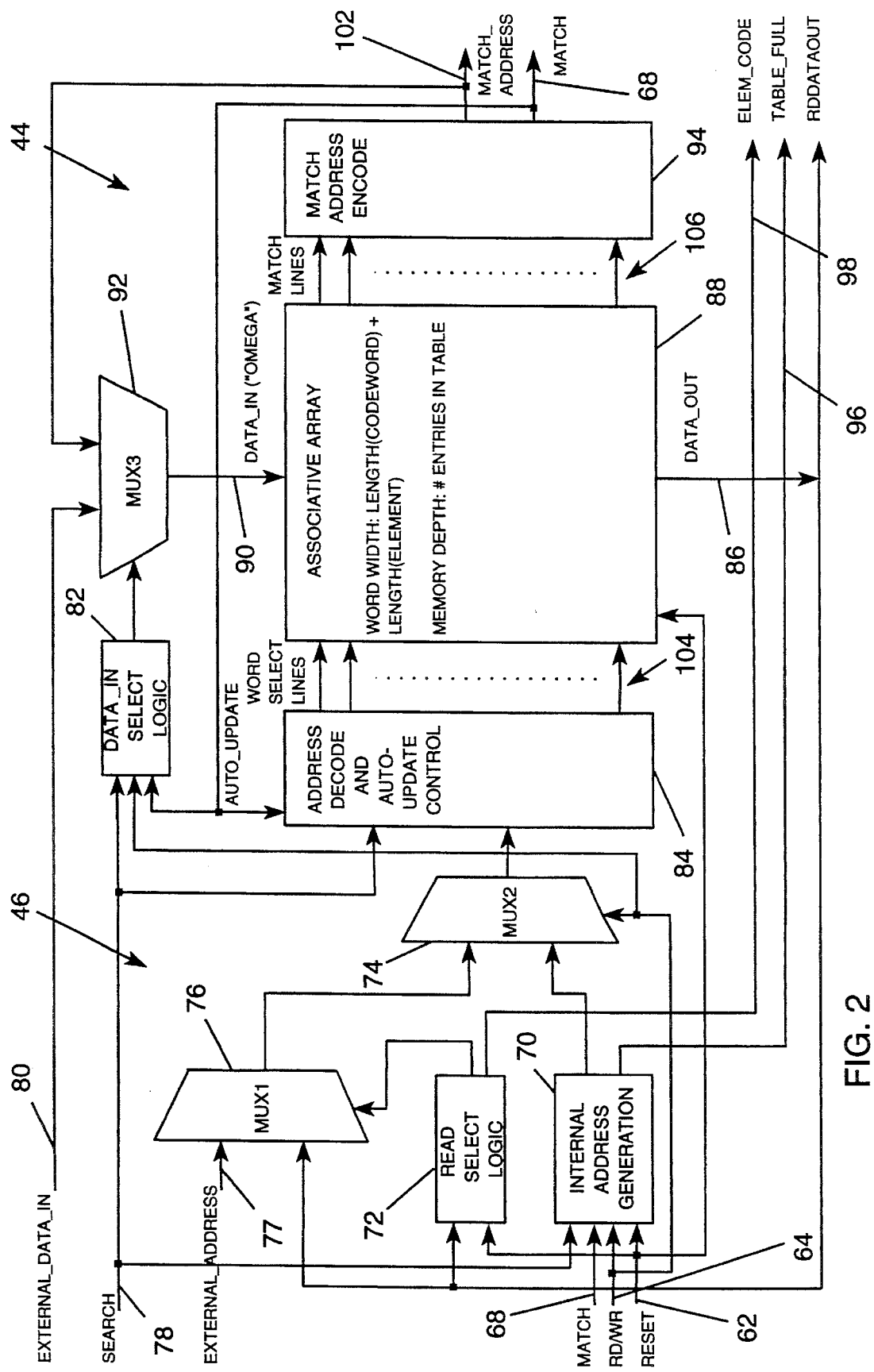
FIG. 2 is a detailed block diagram of the memory and control logic circuitry of FIG. 1.

FIG. 2 is a detailed block diagram of the string table memory 44 and the control logic 46 in FIG. 1. The string table memory comprises an associative array in the form of a content-addressable RAM (CAM) 88 with additional internal logic that reduces compression/decompression process time. The CAM 88 is organized into "words" (e.g., 3832×20 bits) whereby each word stores a separate character string entry. Data is written into memory 88 on a data bus 90 (DATA_IN). Data bus 90 receives an external character string (K) input on bus 80 and an encoded character string (OMEGA) on data bus 102 via multiplexer 92 (MUX3). The external characters on bus 80 come from the uncompressed data stream on RAWDATA bus 54 (FIG. 1) and the codewords come from the output of encoder 94. A data input select logic circuit 82, through multiplexer 92, controls which bits of DATA_IN come from the external character string on bus 80 and the codeword on bus 102. The data input select logic circuit 82 is driven by a search signal input 78, a read/write signal input 64, both from control logic 46 (FIG. 1), and a match signal input 68 from encoder 94.

Memory 88 provides a set of match signals via match lines 106 (e.g., 264 through 4095). There is one match signal associated with each word in memory 88. When the character string on bus 90 matches one of the data entries in memory 88, the match signal associated with that memory location is activated. Encoder 94 encodes all match signals from memory 88, in turn generating the codeword provided on bus 102. The codeword is thereby equal to the address location of the matched data entry in memory 88. Encoder 94 also generates a match signal 68 that is activated when any data entry in memory 88 is matched with the character string on data bus 90.

An address decoder 84 selectably receives either external compressed characters over external address bus 77, the internal character string output from memory 88 on data bus 86, or an internal address from an address generator 70 and accesses the associative array 88 via word select lines 104 (e.g., 264 through 4095). The external compressed characters on bus 77 come from the compressed data stream on COMPDATA bus 58 (FIG. 1). The internal address generator 70 is controlled by match signal 68 from encoder 94, search signal 78, a read/write signal 64, and a reset signal 62. The read/write and reset signal come from control logic 46 (FIG. 1). The address generator includes a counter which is reset (e.g., to 264) upon initialization and subsequently incremented as the dictionary is built up.

The source of the address supplied to address decoder 84 is controlled by read select logic 72 and the read/write signal 64 through multiplexers 76 and 74 respectively. Read select logic 72 is controlled by reset signal 62 and the compression status of the data entry output 86 from memory 88. The data entry compression status can be determined by the value of data entry characters. For example, values greater than 256 may be allocated for encoded character strings and values less than 256 may comprise single data characters. Multiplexer 76 (MUX1) selects an input from either bus 77 or bus 86 and multiplexer 74 (MUX2) selects between the output of mux 76 and the output of address generator 70. Decoder 84 also includes an automatic update feature described below that allows a data search and memory update to be performed in the same memory access cycle.

Figure 3:
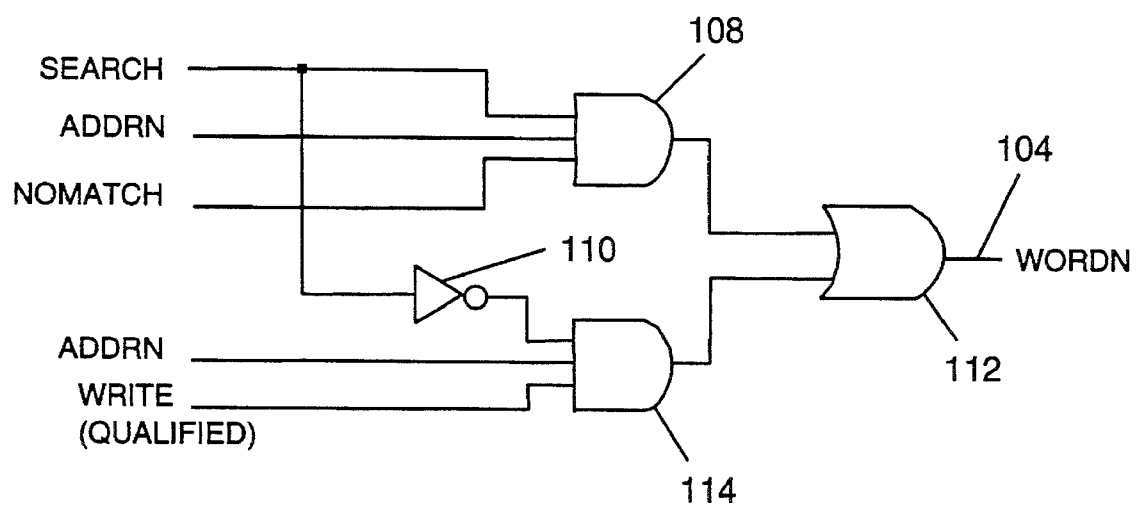
FIG. 3 is a logic diagram of the auto-update circuitry within the address decoder of FIG. 2.

FIG. 3 is a logic diagram of a preferred implementation of the automatic update feature of address decoder 84 in FIG. 2. Each address (ADDRN[19:0]) input into address decoder 84 from MUX2 74 is fed into two AND gates. AND gates 108 and 114 illustrate a single address line. AND gate 108 is also fed search signal 78 (FIG. 2) and the inverted value (NOMATCH) of match signal 68 (FIG. 2). The search signal is also inverted via invertor 110 and fed into AND gate 114 along with a "qualified" write signal. OR gate 112 receives the outputs from the two AND gates and generates a word select signal (WORDN). The equivalent function can be provided by multiplexers or other combinational logic.

The update circuit is activated when a data search is performed during data compression operation. If a search fails during a data compression, the character string must be placed into the next available address in memory. To eliminate the additional clock cycle necessary to write the data word into memory after a data search, gate 108 goes high if a match does not occur. Since the character string is already on data bus 90 and the address for the next available address is already set by address generator 70, a write can be performed immediately after a non-match indication occurs. Thus, the inverted match signal NOMATCH activates gate 108 activating the word line (WORDN) associated with the next available memory location.

If a match is found during the search operation, the word select line is disabled and no write operation takes place. The qualified write signal is used to force data writes even when no match occurs in memory, for example, during an external microprocessor write operation. This update feature provides true 1 cycle per byte performance since dictionary writes are "transparent," not requiring an extra memory access.

In the alternative, the circuit in FIG. 3 may be used to set a "data_valid" field within memory. For example, the system in FIG. 2 can copy each new character string into memory prior to checking for a match in memory. If a match does occur, the WORDN signal is then used to activate a "data_valid" field associated with the newly stored data string.

Theory of Operation

Data Compression

A microprocessor (not shown) initializes the system for compression and resets memory 88. The microprocessor control signals (search signal 78, read/write signal 64, reset signal 62) come from the uncompressed data interface 52 via control logic 46 (FIG. 1). The reset line may be used for various initialization operations. For example, the reset line is coupled to memory 88 to reset the data_valid field associated with each memory location. In addition, the reset line initializes the address generator to a starting memory location for storing character strings.

Several different techniques may be used for initializing single input characters. For example, single input characters may be algorithmically encoded as part of the compressed data stream. Alternatively, a set of encoded values each representing any single input data character may be loaded into memory.

The read/write line 64 directs mux 74 to connect the address provided by address generator 70 to address decoder 84. An external character string from uncompressed data interface 38 (FIG. 1) is supplied to the byte field (DATA_IN [7:0]) and the codeword field (DATA_IN [19:8]) of bus 90. Search signal 78 is then activated, causing memory 88 to compare the codeword/byte string with each location in memory 88. No match will initially occur since nothing has been previously written into memory 88. Therefore, the codeword/byte string on bus 90 is written into the first available address location in memory 88 (e.g., the initialized address generated by address generator 70). Address generator 70 is then incremented and a new input character from bus 80 is read into the byte field of the memory data input. The process is repeated, continuing to write unmatched codeword/byte strings into memory 88.

On a successful match, input data select logic 82 directs multiplexer 92 to place the codeword generated from encoder 94 in the codeword field of data bus 90 (DATA_IN [19:8]). A new external character from bus 80 is then fed into the byte field (DATA_IN [7:0]) of data bus 90. The codeword thereby represents the previously matched character string. Because the codeword assigned to the character string is derived directly from the matched data entry address, significantly less control logic is required to encode input characters. In addition, by feeding the codeword back into multiplexer 92 (MUX 3) and combining the codeword with the next input character, an input character can be processed each clock cycle.

The new codeword/byte string is then compared with the data entries within memory 88. The process is repeated until no match is found. At this point, the compressor outputs the codeword from the last match and writes the new codeword/byte string into memory 88. The last input character (K) fed into the byte field is then compared with the updated dictionary (in the case of dictionary initialized to contain "root" codewords) by searching memory for the byte K paired with a null codeword, thereby generating a root codeword to commence a new string. A new external character (K) from bus 80 is then fed into the byte field and the match process is repeated building on a new string (per LZW). Alternatively, the last character K can be output following OMEGA (as in LZ2) or the address of K can be output as the codeword for K following OMEGA.

When the dictionary fills up, address generator 70 activates a table-full signal 96 that indicates to the rest of the compression system (FIG. 1) that no further character strings can be written into memory. Any additional input data is then compressed according to the present entries stored within memory 88.

Data Decompression

For data decompression the operation starts by resetting memory 88 and initializing the circuit for compressing input data. Decompression involves linked-list decompression traversal. For example, a compressed data address may simply refer to an address in memory where the decompressed data string is located (e.g., a "root" codeword of a linked list). The address however may have a "non-root" codeword (e.g., the codeword is a link to the next address required to further decompress the encoded character string). As mentioned above, "root" and "non-root" codewords can be determined in a variety of ways. For example, by the value of the codeword or in the alternative with an identifier bit within memory.

When the compressed data interface 48 (FIG. 1) has compressed data available, it is written to decoder 84 on external address bus 77. After receiving a "non-root" codeword, the memory is read, and (assuming a valid location) the byte field (DATA_OUT [7:0]) of bus 86 is pushed onto a LIFO stack inside control logic 46 (FIG. 1). The codeword field (DATA_OUT [19:8]) of bus 86, if a non-root codeword, is fed back to address decoder 84 via MUX1 and MUX2 and another memory read is performed. Prior to the non-root codeword feedback, the last byte of the data entry read from memory is pushed into FIFO 40. This process terminates when a memory read results in a "root" codeword, at which time a new codeword is read from external address bus 77.

After a root codeword is identified, the last decoded character output is concatenated with the previous external encoded character and read into the next available address in memory 88. Read select logic 72 checks for "root" codewords and directs multiplexer 76 accordingly to connect external address bus 77 or the DATA_OUT bus 86 back into address decoder 84. Read select circuit 72 also supplies a coded element signal 98 to control logic 46 to indicate a completely decompressed codeword. FIFO 40 then dumps the decompressed decoded characters on bus 54.

The system in FIG. 2 simplifies the decompression operation. Since decompression involves linked list traversal, the built-in logic provides feedback of the memory output data back into the address decoder without additional interaction with external decompression logic (FIG. 1). Therefore, each decompression cycle will require less time and the decompression control logic is simplified. There are a number of different implementations for "qualifying" valid words and codewords in memory 88. One method is to use a comparator scheme, and another is to use an extra, resettable bit for each word. The technique used is dependent upon specific application requirements. In a unidirectional system (e.g., CDROM), the decompression circuit can be further simplified, using a conventional RAM with feedback circuitry as described above for linked list traversal.

Figure 4:
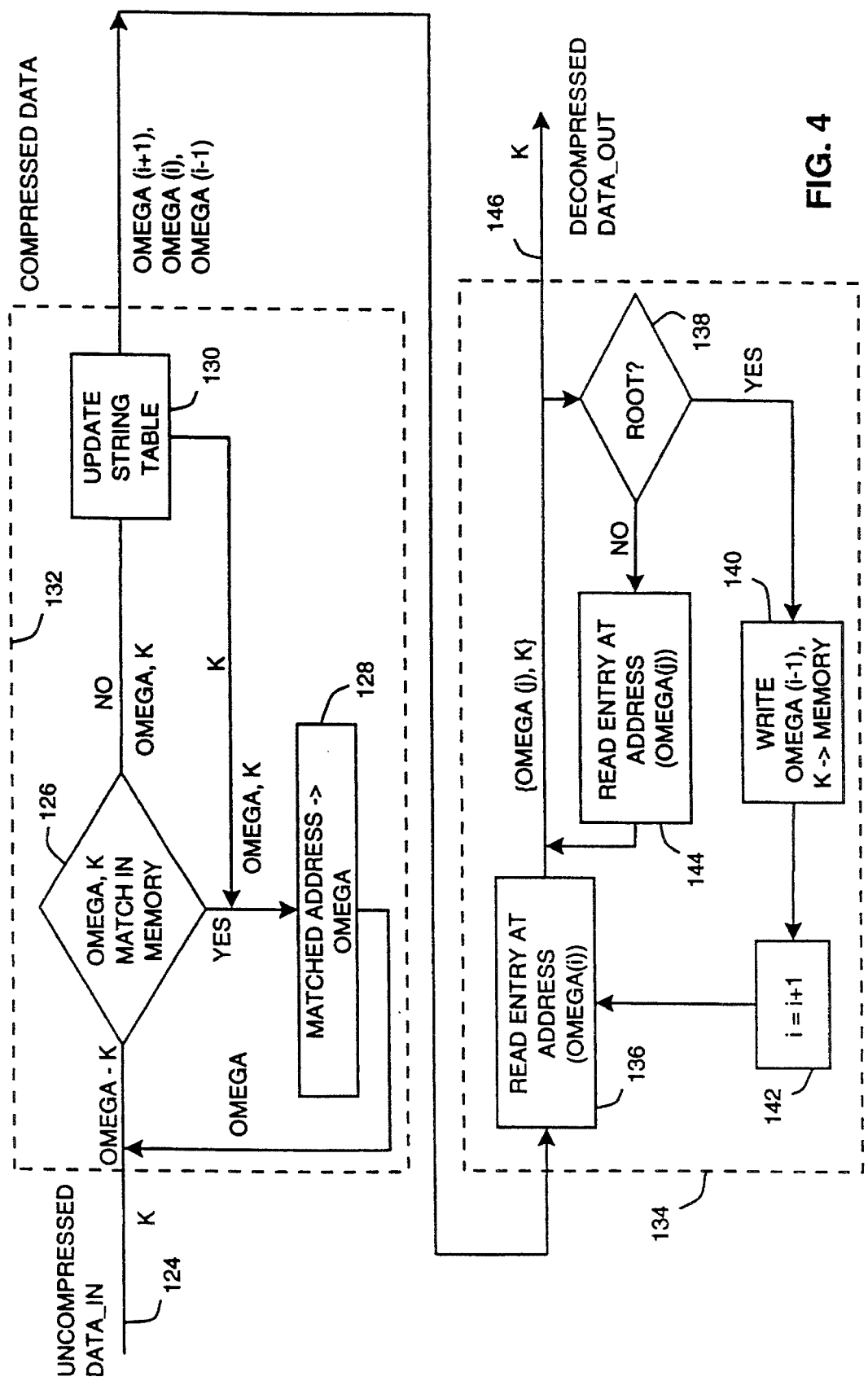
FIG. 4 is a generalized data flow diagram for the data compression/decompression method according to the present invention.

FIG. 4 is a data flow diagram showing the general method for data compression/decompression or linked list storage/retrieval in a system according to the present invention. The method illustrated below is adaptive such that the dictionary is embedded in the codewords and thereby does not need to be transferred separately with the compressed data. Alternative methods, for example, where the dictionary is transferred with the compressed data, can also be implemented using the present system.

Dashed block 132 is the compression process and dashed block 134 is the decompression process for the system. Uncompressed data (K) at input 124 is supplied to decision block 126 along with the coded character string (OMEGA) output from block 128. As noted above, OMEGA represents an address of a data entry encoding a character string. OMEGA and K are concatenated together and compared with the entries within the dictionary in decision block 126. If the OMEGA-K input matches an entry in memory, block 128 encodes the input with the address of the matched data entry. This encoded value (new OMEGA) is then fed back, concatenated with the next external character K and input into decision block 126. This process is repeated until an OMEGA-K string does not match any entries within memory. Block 130 then updates the string table memory with the OMEGA-K string, outputs OMEGA, and feeds the character K into coding block 128. K is encoded in Block 128 and concatenated with the next external data character K before being fed back into decision block 126.

The encoded data, OMEGA, is sent to block 136 for decompression. A given encoded input character (OMEGA(i)) is used as an address for accessing the string table memory. Decision block 138 determines if the data entry at the address OMEGA(i) is a root character. If it is, there are no additional encoded characters in the data entry output from memory (e.g., OMEGA(j) does not exist). The memory data entry for K is then output as a decompressed output character on line 146. Decision block 138 jumps to block 140 where the previous encoded character (OMEGA(i-1)) is concatenated with K and written into the next available memory address location. Block 142 then directs block 136 to use the next encoded character (OMEGA(i+1)) in the input stream as the address location for the next data entry read from memory.

If the output from the string table memory is not a root (e.g., the output comprises an encoded character (OMEGA(j) and a decoded character K), K is output on line 146 and decision block 138 jumps to block 144. Block 144 uses the encoded character (OMEGA(j)) as the address for the next data entry output from memory. The data entry at memory location OMEGA(j) is then processed as described above. The process is repeated until every encoded input character is decompressed.

Figure 5:
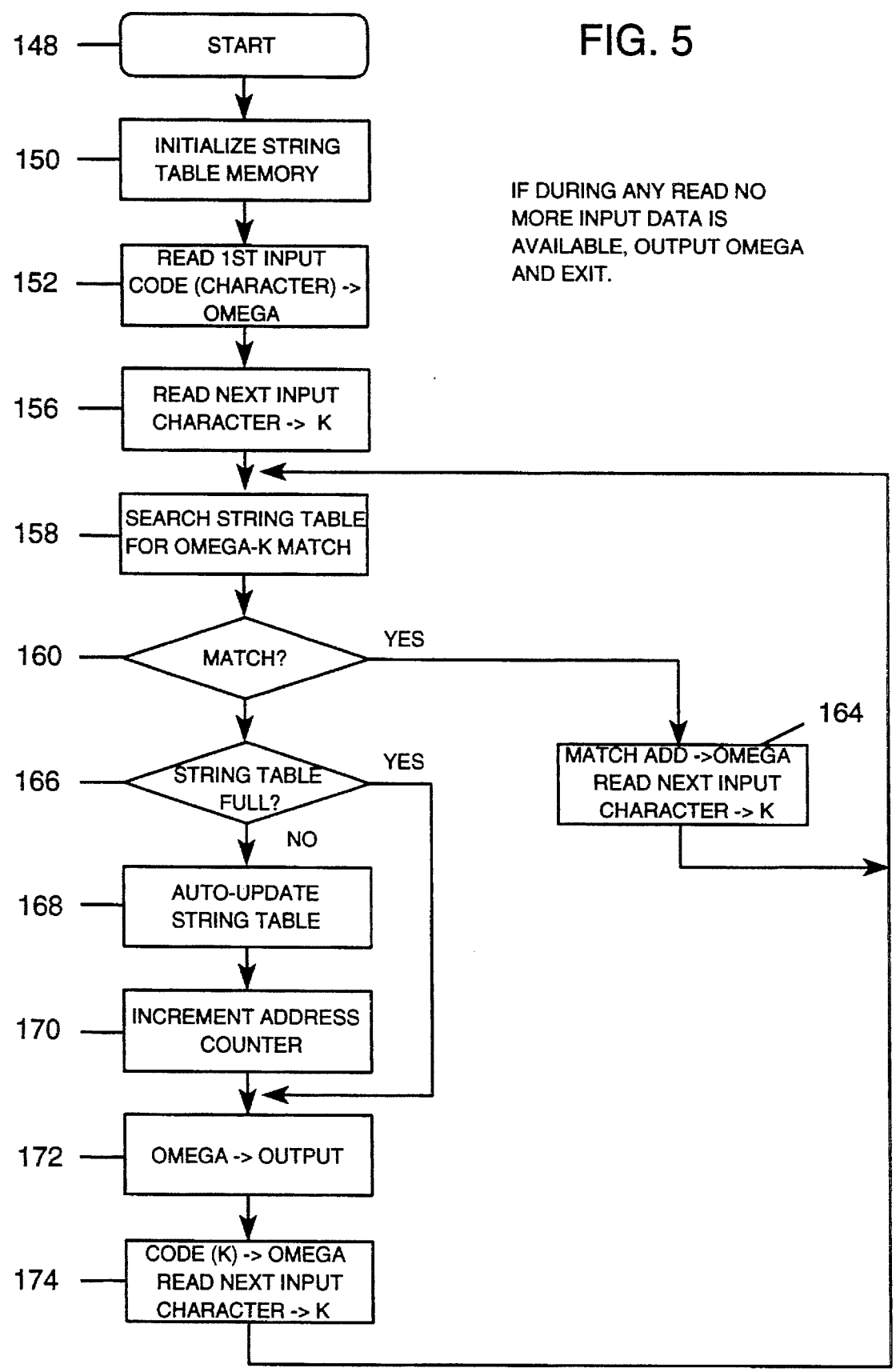
FIG. 5 is a detailed data flow diagram for the data compression procedure of FIG. 4.

FIG. 5 is a detailed data flow diagram of dashed block 132 in FIG. 4. The data compression process begins when a start or reset signal is instigated in block 148. A memory circuit (described below), is initialized in block 150, for example, to operate in the compression or decompression mode and to reset the dictionary. Any dictionary valid bits need to be initialized, preferably in parallel. The dictionary may be initialized either with single character codewords or with a set of codewords externally generated in accordance with a selected coding algorithm, such as LZW disclosed in Welch U.S. Pat. No. 4,558,302 or DCLZ disclosed in the ECMA-151 Standard, paired with a null codeword to identify the entry as a single character or "root" codeword. Alternatively, rather than pre-storing a set of codewords, they could be generated real time each time a match fails, as disclosed in commonly-assigned application Ser. No. 07/610,372, filed Nov. 7, 1990, now U.S. Pat. No. 5,142,282, on Data Compression Dictionary Access Minimization. Other initialization schemes can be used, including an empty dictionary.

The first character in an input data stream is read in block 152 and either stored directly in the OMEGA field or encoded (e.g., CODE(CHAR)) then stored in the OMEGA field. Then, the next input character (K) in the input data stream is read in block 156. Block 158 shows a process which combines OMEGA and K together as a character string (i.e. concatenates OMEGA-K) and then searches the dictionary for a data entry that matches the OMEGA-K string. Since no data string has yet been stored in the dictionary, decision block 160 indicates that there is no match. Since the OMEGA-K string is not presently represented, it is stored in memory if decision block 166 determines there is available storage space. If the memory is not full, the operation in block 168 automatically loads the OMEGA-K string into the next available memory storage location (ADDR(N)). Block 170 then increments an address counter to identify the next available storage location in memory (ADDR(N+1)). The encoded value OMEGA (an address) for the first input character, if applicable, is output as the first character in the encoded data string in block 172.

When the memory is full, the compression system can simply be disabled from writing any additional character strings into memory. For example, if decision block 166 determines that the memory is full, the character string loading step of block 168 and the address counter incrementing step of block 170 are skipped and the process jumps to the encoding and output process of block 172, further described below.

After OMEGA is output, the step of block 174 replaces the first input character (OMEGA) with the second input character (K) or CODE(K). The next input character from the input data stream is then read (K) thereby providing the next OMEGA-K string. The process then loops back to block 158 where the memory is searched with the new OMEGA-K string.

If a match is indicated by decision block 160, the process jumps to block 164 where the OMEGA field is replaced with an encoded value representing the OMEGA-K string, which is equal to the match address. The next input character from the data stream is then copied into the K field. The OMEGA and K fields are combined, forming a new OMEGA-K string which now represents three input characters. The process returns to block 158 where dictionary data entries are compared with the new character string. Additional input characters are added to the character string as long as the previous character string matches a data entry in memory. When a new character string no longer matches a data entry, decision block 160 jumps to block 166 where the memory update procedures of blocks 166, 168, and 170 are performed as described above.

Block 172 outputs the value OMEGA (e.g., the encoded character string from the last input character string/data entry match). Block 174 takes the last character in the character string (e.g., the character that caused the character string to no longer match any data entry in the string table) and copies it into the OMEGA field. Block 174 then copies the next input character from the input data stream into the K field and the process loops back to block 158. The character string is thereby compressed since the single encoded value of OMEGA output from the compression process represents multiple input characters.

Figure 6:
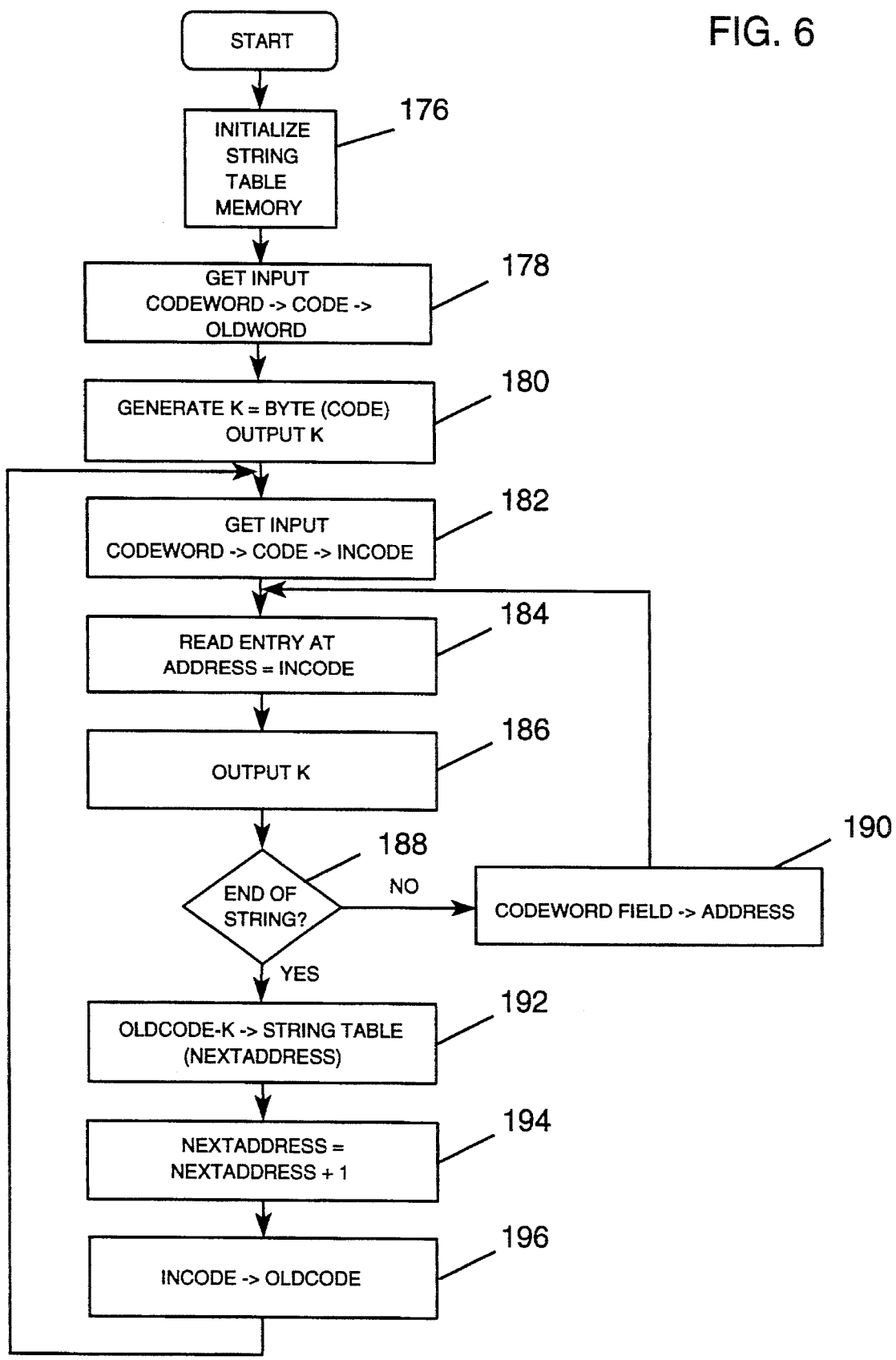
FIG. 6 is a detailed data flow diagram for the data decompression procedure of FIG. 4.

FIG. 6 is a detailed flow diagram of decompression circuit 146 in FIG. 4. Block 176 initializes the string table memory for decompression. Block 178 gets the first encoded word (OLDWORD). If no more data is available during this or any subsequent input read step, then the process is exited. The first encoded word is decoded at block 180, either algorithmically or by reading a preloaded entry in the string table memory. The first encoded word is a root character and is therefore decoded and output.

Block 182 gets the next encoded word (INCODE) and block 184 uses INCODE as the address of the data entry output by the string table. Initially, in one implementation, the string table will consist of only single character bytes, so block 184 will output a byte Ko Byte K is then output in block 186. In later cycles, block 184 will return OMEGA-K as discussed further below.

Decision block 188 determines whether the byte is the end of a string (e.g., root character) and, if so, jumps to block 192. Block 192 builds a new data entry in the next available address in the string table which consists of the concatenation of the first encoded input word (OLDCODE) and the last byte output (K). Block 194 points to the next unused address location and block 196 replaces OLDCODE with the last encoded input word (INCODE) and returns to block 182.

Block 182 reads the next encoded input word (INCODE) and block 184 outputs the data entry at the address INCODE. If the data entry output at address INCODE is not a root, it will include a decoded byte K and a codeword field pointing to a next address for further decoding (OMEGA). Block 186 will then output K and decision block 188 will jump to block 190. Block 190 uses the codeword field (OMEGA) as the address of the next data entry output from the string table and then loops back to block 184. The process is repeated until the data entry output from the string table contains a root character (i.e., is the end of a string). Decision block 188 then proceeds to block 192 where the previously read encoded word (OLDCODE) is concatenated with the last output byte (K). The functions in blocks 194 and 196 are then performed and then the process returns to block 182. Thus, the decompression process regenerates the original data stream compressed in the compression process of FIG. 5.

Figure 7:
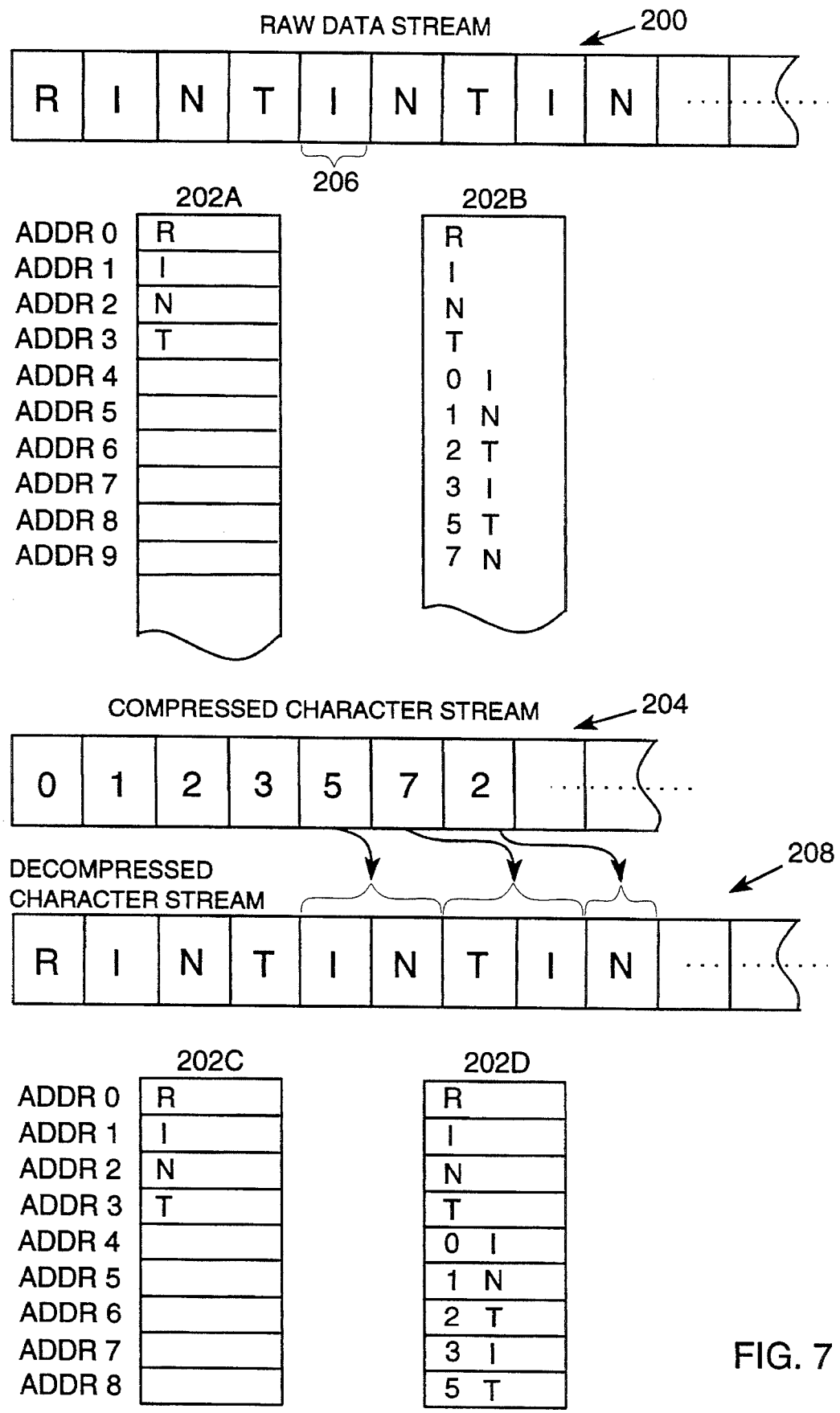
FIG. 7 is a graphical depiction of the compression and decompression procedures in FIGS. 5 and 6.

FIG. 7 is a graphical depiction of the compression and decompression algorithms in FIGS. 5 and 6. A raw data stream 200 comprises an uncompressed string of characters which are input to the data compression/decompression process illustrated in FIG. 4. In this example, single characters R,I,N, and T have been loaded during initialization into locations Addr0, Addr1, Addr2, and Addr3 of memory 202A respectively. Input characters are encoded by assigning each character the value of its address location, however, to increase compression speed, single input characters can be encoded algorithmically prior to initiating the process described below. Memory 202A illustrates the dictionary in its state immediately after initialization and memory 202B illustrates the dictionary after compression is complete.

The first input character R, from data stream 200, matches the data entry at address location Addr1. Since there was a match, the compression system concatenates the encoded value for R (Addr0=0) with the next input character "I", and memory 202A is searched for a "0I" match. Because there is no "0I" match in memory, "0I" is written into the next available memory location (Addr 4), as illustrated in memory 202B. The codeword for the largest matched sequence (i.e., the codeword for "R"× 0) is output as the first encoded character in compressed character stream 204. The compression system now searches memory 202B for the string comprising the encoded value for "I" (i.e., Addr1=1) concatenated with the next input character "N". Since the string "1N" is not in the dictionary, it is written into the next available memory location (Addr5), as shown in 202B. The value 1 (e.g., last matched character string="I") output as the second encoded character in compressed character stream 204.

The process continues to build memory 202B and encode input characters in a similar manner until the second "I" in the uncompressed character stream 200 is processed (e.g., character 206). The compression system encodes "I" with the value 1, since "I" is located at address location Addr1. The encoded value 1 is concatenated with the next input character N and the string "1N" is compared with the data entries in memory 202B. Since the sequence "1N" has occurred previously in character stream 200, the string "1N" matches an entry in memory (e.g., data entry at Addr5). The string "1N" is therefore encoded as "5" and concatenated with the next input character "T". Since the string "5T" does not match any entry in memory 202B, "5T" is written into the next available address location (Addr8) and the codeword for the last matched character string "5" is output in character stream 204. The encoded value for input character "T" (Addr3=3) is then concatenated with the next input character "I" and the process is repeated. Memory 202B shows all characters built for the dictionary from character stream 200. Character stream 204 is the complete compressed character stream for raw data stream 200. Notice that only six encoded characters are required to represent the nine characters in character stream 200.

The decompressor dictionary is reinitialized for decompression as illustrated in 202C so the first four address locations contain the decoded values for the single input characters R, I, N, and T respectively. Again, single character decoding may also be preformed algorithmically. The first encoded input character "0" is used as an address into memory 202C. The decompression system determines that the value "0" is a root codeword, for example, by checking that the value is less than 4. The data entry at Addr0 (e.g., "R") is thereby output as the first character in decompressed character stream 208. The decompression system then reads the next encoded input character "1". This value is again a root codeword and therefore the data entry at Addr1 is output as the second character "I" in decompressed character stream 208.

At this point, a new dictionary entry is built using the last decompressed character "I" concatenated with the previous codeword "0". The string "0I" is then written into the next available address location (Addr4), as shown in memory 202D. The next codeword "2" is input and the process is repeated. This time the data entry at address location Addr2 (e.g., N) is output and then the string "1N" is written into memory at address location Addr5.

The process is repeated in the same manner until input character "5" is read by the decompression system. The decompression engine uses this codeword to reference the data entry at Addr5. The encoded character "5" is not a root since it is greater than three, therefore, the decompression system outputs the last byte of the data entry at address location Addr5 (e.g., "N"). The rest of the data entry (e.g., "1") is used as the next address. Since the codeword "1" is a root, the data entry at Addr1 (e.g., "I") is output and no further decompression is required. The decompressed characters "IN" are then placed in character stream 208. A new data entry in memory is written into address location Addr7 using the last decompressed output character "I" and the previous encoded input character "3". The process is repeated until all characters in character stream 204 are decompressed. It will be noted that dictionaries built using the HP-DC scheme with hashing are different. In contrast, the compression and decompression dictionaries 202B and 202D built by the present system and method have identical addresses/entries.

Having described and illustrated the principles of the invention in a preferred embodiment thereof, it should be apparent that the invention can be modified in arrangement and detail without departing from such principles. I claim all modifications and variation coming within the spirit and scope of the following claims:

1. A circuit for use in compressing data character strings according to a dictionary based data compression algorithm, the circuit comprising:

a memory for storing compressed character strings, the memory including:
(a) a data input for receiving OMEGA-K inputs, each OMEGA-K input containing in part a codeword (OMEGA) and in part a data character string (K);
(b) a plurality of storage locations for storing the OMEGA-K inputs as data entries, each storage location having a corresponding memory address;
(c) means for simultaneously comparing an OMEGA-K input received by the data input with every previously stored data entry to determine if the OMEGA-K input matches any of the stored data entries; and
(d) a plurality of match indication outputs each corresponding to one of the plurality of storage locations, each match indication output indicating a match between an OMEGA-K input and the corresponding data entry;

a match address encoder coupled to the match indication outputs of the memory to derive a new codeword (OMEGA') equal to the address of the storage location of the stored data entry that matches the OMEGA-K input; and input generator means, operatively coupled to receive the new codeword (OMEGA') from the match address encoder, for generating a next OMEGA'-K' input containing in part the new codeword (OMEGA') equal to the address of the storage location of the stored data entry that matches the previous OMEGA-K input and in part a next data character string (K') and for supplying the next OMEGA'-K' input to the data input of the memory.

2. A circuit according to claim 1 including means for writing an OMEGA-K input to a storage location having a selected address; and address generation means for incrementally selecting addresses of unused storage locations to store the OMEGA-K inputs.

3. A circuit according to claim 1 including means for reading a data entry stored in a storage location at an address defined by one of the codewords (OMEGA); and data feedback means for using the data entry read from the storage location in the memory as a next, linked-list memory address of previously stored OMEGA-K input to decompress a compressed character string.

4. A circuit according to claim 1 including an automatic memory update circuit coupled to the address match encoder for initiating a write of the OMEGA-K input into memory when the OMEGA-K input does not match any of the stored data entries in the memory.

5. A circuit according to claim 4 wherein the memory comprises a content addressable memory capable of performing search and write operations at the same time thereby allowing the automatic memory update circuit to selectively initiate the write of the OMEGA-K input to a memory address in a clock cycle simultaneous with searching the memory for a data entry that matches the OMEGA-K input.

6. A method for encoding a series of data character strings according to a dictionary based data compression algorithm, the method comprising the following steps:

providing a memory having unique data strings stored as data entries therein;

inputting a series of data character strings into the memory;

simultaneously comparing individual character strings of said series to every stored data entry in the memory to determine if the individual character string matches or fails to match any of the data entries;

in the case of a match, determining an address of the storage location of the data entry that matches the character string deriving a codeword equal to the address of the storage location, and combining the codeword with a next character string in said series; and in the case of no match, storing the character string in the memory at an unused storage location.

7. A system for storing a linked list data structure according to a dictionary based data compression algorithm, the system comprising:

means for inputting an OMEGA-K string consisting of a codeword (OMEGA) followed by a string of characters (K);

a content addressable memory for storing a plurality of OMEGA-K strings as data entries at corresponding address locations;

means for simultaneously comparing an OMEGA-K string with every previously stored data to determine if the OMEGA-K string matches or fails to match any of the stored data entries;

means responsive to a match for substituting the address of the stored data entry that matches the OMEGA-K string as a new codeword (OMEGA') and means for inputting a new string of characters (K') to form a new OMEGA'-K' string; and means responsive to a non-match for updating the memory to store the OMEGA-K string that fails to match any stored data entries as a new data entry at a new address location, the new data entry comprising an address location of a subset of a character string represented by the codeword (OMEGA) portion of the new data entry.

8. A system according to claim 7 including means responsive to an OMEGA-K string for traversing a link list of data entries in the memory to regenerate said string of characters.

9. A circuit for compressing and storing data according to a dictionary based data compression algorithm, the circuit comprising:

a content addressable memory including:
(a) a data input for receiving OMEGA-K inputs, each OMEGA-K input containing in part a codeword (OMEGA) and in part a data character string (K);
(b) a plurality of storage locations for storing the OMEGA-K inputs as data entries, each storage location having a corresponding memory address;
(c) a plurality of word select inputs for selecting corresponding storage locations;

(d) means for simultaneously comparing an OMEGA-K input received by the data input with multiple stored data entries to determine if the OMEGA-K input matches any of the stored data entries; and (e) a plurality of match indication outputs for corresponding storage locations, individual match indication outputs indicating a match between an OMEGA-K input and a stored data entry; a match address encoder coupled to the match indication outputs of the content addressable memory, the match address encoder outputting (1) in the case of a match, a match signal and deriving a new codeword (OMEGA') equal to the address of the storage location of the stored data entry that matches the OMEGA-K input and (2) in the case of no match, a non-match signal;

an address encoder coupled to the match address encoder to activate in response to the non-match signal a word select input of the content addressable memory associated with an unused storage location in order to store the OMEGA-K input at the unused storage location; and concatenating circuit coupled to the match address encoder to produce in response to the match signal a next OMEGA'-K' input containing in part the new codeword (OMEGA') equal to the address of the storage location of the stored data entry that matches the previous OMEGA-K input and in part a next data character string (K'), the concatenating circuit supplying the next OMEGA'-K' input to the data input of the content addressable memory.

10. The circuit according to claim 9 wherein in the case of no match, the address encoder activates the word select input to store the OMEGA-K input at the unused storage location during the same clock cycle that the content addressable memory simultaneously compares the OMEGA-K input with multiple stored data entries and fails to detect a match.

* * * * *